United States Patent [19]

Shin

[11] Patent Number: 5,070,255

[45] Date of Patent: Dec. 3, 1991

[54] MULTI-LEVEL SELECTING CIRCUIT
[75] Inventor: Yasuhiro Shin, Tokyo, Japan
[73] Assignee: Oki Electric Industry Co., Ltd., Tokyo, Japan
[21] Appl. No.: 634,448
[22] Filed: Dec. 27, 1990
[30] Foreign Application Priority Data Dec. 29, 1989 [JP] Japan .................. 1-343927

[51] Int. Cl.⁵ .................. H03K 5/01; H03K 3/01
[52] U.S. Cl. .................. 307/268; 307/264; 307/243; 307/296.2; 340/784
[58] Field of Search .................. 307/296.2, 264, 268, 307/243, 242, 561, 559, 565, 584; 340/784, 811

[56] References Cited

U.S. PATENT DOCUMENTS

| | | | |
|---|---|---|---|
| 4,356,413 | 10/1982 | Rosenbluth et al. | 307/242 |
| 4,523,161 | 6/1985 | Miles | 333/81 R |
| 4,734,751 | 3/1988 | Hwang et al. | 307/242 |
| 4,810,059 | 3/1989 | Kuijk | 340/784 |

FOREIGN PATENT DOCUMENTS 0126822 5/1989 Japan .................. 307/540

Primary Examiner—Stanley D. Miller
Assistant Examiner—Toan Tran
Attorney, Agent, or Firm—Edward D. Manzo

[57] ABSTRACT

A multi-level selecting circuit has a selecting section provided in a semiconductor chip by a CMOS process for selecting one of a plurality of input levels at a time, input terminals provided on the semiconductor chip for feeding a plurality of levels to the selecting section, and an output terminal provided on the semiconductor chip for outputting one of the plurality of levels having been selected by the selecting section. The selecting section has a plurality of MOS transistors each being provided in the semiconductor chip and connected between respective one of the plurality of input terminals and the output terminal for feeding, when turned on by external control, the input level on the input terminal to the output terminal. Source connecting lines each is connected between respective one of the input terminals and the source electrode of respective one of the MOS transistors for feeding a voltage on the input terminal to the source electrode. A back-gate connecting line is connected between the input terminals and the back-gates of the MOS transistors for feeding a predetermined voltage applied to the input terminals to the back gates. The back-gate connecting line is substantially independent of the source connecting lines. A diode is connected between one of the input terminals to which the highest voltage or the lowest voltage is applied and another input terminal to which a medium voltage close to the highest or lowest voltage is applied. The diode has an anode connected to the low voltage side and a cathode connected to the high voltage side.

13 Claims, 12 Drawing Sheets

MULTI-LEVEL SELECTING CIRCUIT

BACKGROUND OF THE INVENTION

1. Field of the Invention

The present invention relates to a multi-level selecting circuit advantageously applicable to, for example, a driver for driving a liquid crystal display (LCD).

2. Description of the Prior Art

An LCD driver, for example, may be constructed to generate three or more different voltages, select one of such voltages at a time, and feed the selected voltage to the LCD, as has been customary in the art. A selecting circuit is built in this type of LCD driver and is often implemented as a multi-level selecting circuit having a plurality of MOS transistors. Specifically, a multi-level selecting circuit has a plurality of MOS transistors each connecting to respective one of input lines to which a plurality of different levels are applied. As any one of the transistors is turned on under external control, one of the different input levels associated with the conductive transistor is fed to the LCD.

The MOS transistors of the above-state multi-level selecting circuit are integrated on a single substrate by CMOS process technologies. Specifically, a plurality of p-MOS transistors and a plurality of n-MOS transistors are arranged on a single substrate. To form the p-MOS transistors, p-channels may be directly provided in the surface layer of an n-type substrate. Regarding the n-MOS transistors, a p-well is formed in the n-type substrate by ion injection, and then n-channels are provided in the surface layer of the p-well.

The problem with the integrated circuit having the well in a substrate is the occurrence of latch-up. Specifically, a parasitic transistor and a parasitic resistor are formed between the substrate and the well and between the well and the channels, constituting a parasitic thyristor which is the cause of latch-up. Latch-up refers to a phenomenon that when an overvoltage is applied to the input side of the circuit, the parasitic transistor is rendered conductive to cause a great current to flow through the circuit. This problem is especially serious when it comes to an LCD driver, as follows.

An LCD driver has a great number of multi-level selecting circuits connected to a level output circuit thereof. Hence, an overcurrent is apt to flow through the MOS transistors of the last-stage multi-level selecting circuit, causing the selecting circuit to latch up. When any one of the selecting circuits latches up, the MOS transistors thereof malfunction to disturb the operation of the LCD. No countermeasures against such latch-up have been proposed in the past in relation to a multi-level selecting circuits which drives an LCD or similar load.

SUMMARY OF THE INVENTION

It is therefore an object of the present invention to provide a multi-level selecting circuit capable of driving a load without dynamic latch-up.

In accordance with the present invention, a multi-level selecting circuit comprises a selecting section provided in a semiconductor chip by a CMOS process for selecting one of a plurality of input levels at a time, input terminals provided on the semiconductor chip for feeding a plurality of levels to the selecting section, and an output terminal provided on the semiconductor chip for outputting one of the plurality of levels having been selected by the selecting section. The selecting section has a plurality of MOS transistors each being provided in the semiconductor chip and connected between respective one of the plurality of input terminals and the output terminal for feeding, when turned on by external control, the input level on the input terminal to the output terminal. Source connecting lines each is connected between respective one of the input terminals and a source electrode of respective one of the MOS transistors for feeding a voltage on the input terminal to the source electrode. A back-gate connecting line is connected between the input terminals and the back-gates of the MOS transistors for feeding a predetermined voltage applied to the input terminals to the back gates. The back-gate connecting line is substantially independent of the source connecting lines.

Also, in accordance with the present invention, a multi-level selecting circuit comprises a selecting section provided in a semiconductor chip by a CMOS process for selecting one of a plurality of input levels at a time, input terminals provided on the semiconductor chip for feeding a plurality of levels to the selecting section, and an output terminal provided on the semiconductor chip for outputting one of the plurality of levels having been selected by the selecting section. The selecting section comprises a plurality of MOS transistors each being provided in the semiconductor chip and connected between respective one of the plurality of input terminals and the output terminal for feeding, when turned on by external control, the input level on the input terminal to the output terminal. Source connecting lines each is connected between respective one of the input terminals and a source electrode of respective one of the MOS transistors for feeding a voltage on the input terminal to the source electrode. A diode is connected between one of the input terminals to which the highest or the lowest voltage is applied and another input terminal to which a medium voltage close to the highest or lowest voltage is applied. The diode has an anode thereof connected to the low voltage side and a cathode thereof connected to the high voltage side.

Further, in accordance with the present invention, a multi-level selecting circuit comprises a selecting section provided in a semiconductor chip by a CMOS process for selecting one of a plurality of input levels at a time, input terminals provided on the semiconductor chip for feeding a plurality of levels to the selecting section, and an output terminal provided on the semiconductor chip for outputting one of the plurality of levels having been selected by the selecting section. The selecting section comprises a plurality of MOS transistors each being provided in the semiconductor chip and connected between respective one of the plurality of input terminals and the output terminal for feeding, when turned on by external control, the input level on the input terminal to the output terminal. Source connecting lines each is connected between respective one of the input terminals and a source electrode of respective one of the MOS transistors for feeding a voltage on the input terminal to the source electrode. A back-gate connecting line is connected between the input terminals and the back-gates of the MOS transistors for feeding a predetermined voltage applied to the input terminals to the back-gates. The back-gate connecting line is substantially independent of the source connecting line. A diode is connected between one of the input terminals to which the highest voltage or the lowest voltage is applied and another input terminal to which a medium voltage close to the highest or lowest voltage is applied. The diode has an anode thereof connected to the low voltage side and a cathode thereof connected to the high voltage side.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Figure 1:
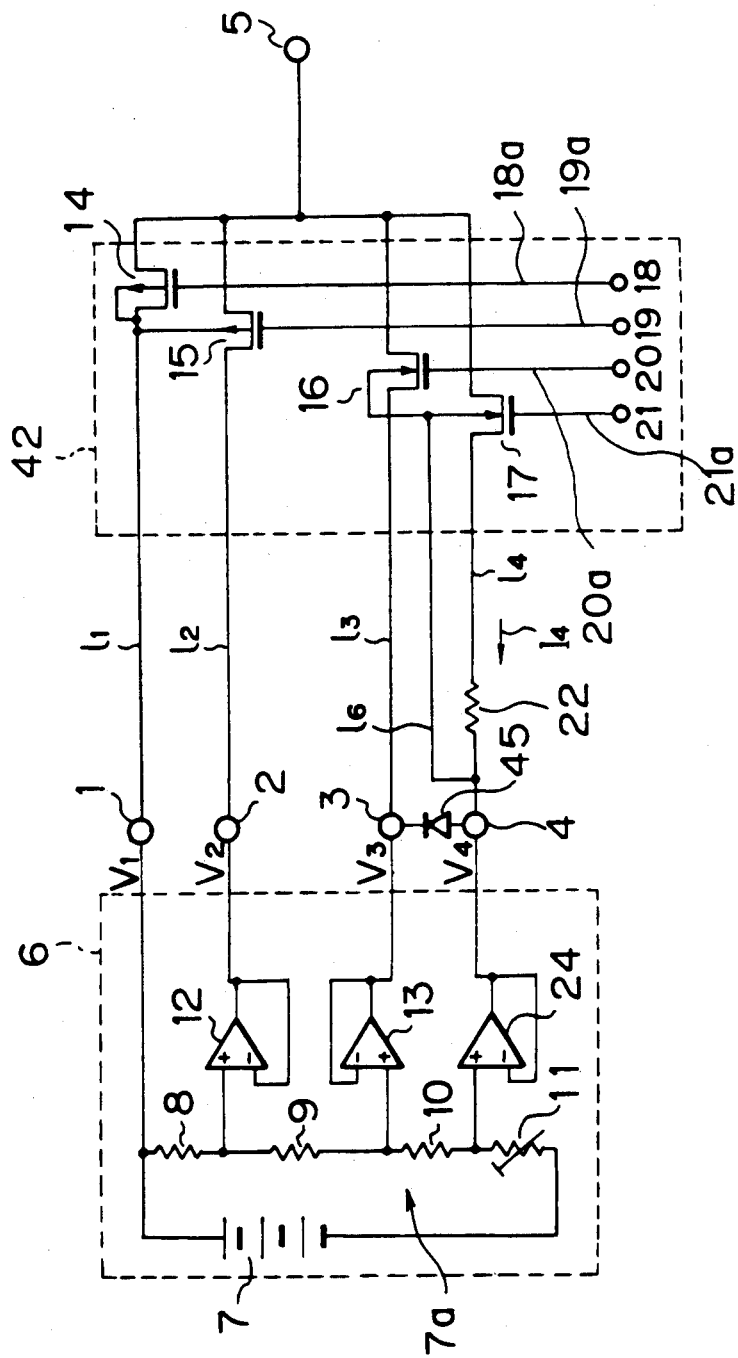
FIG. 1 is a circuit diagram representative of an LCD driver to which is a multi-level selecting circuit embodying the present invention is applied.
Figure 2:
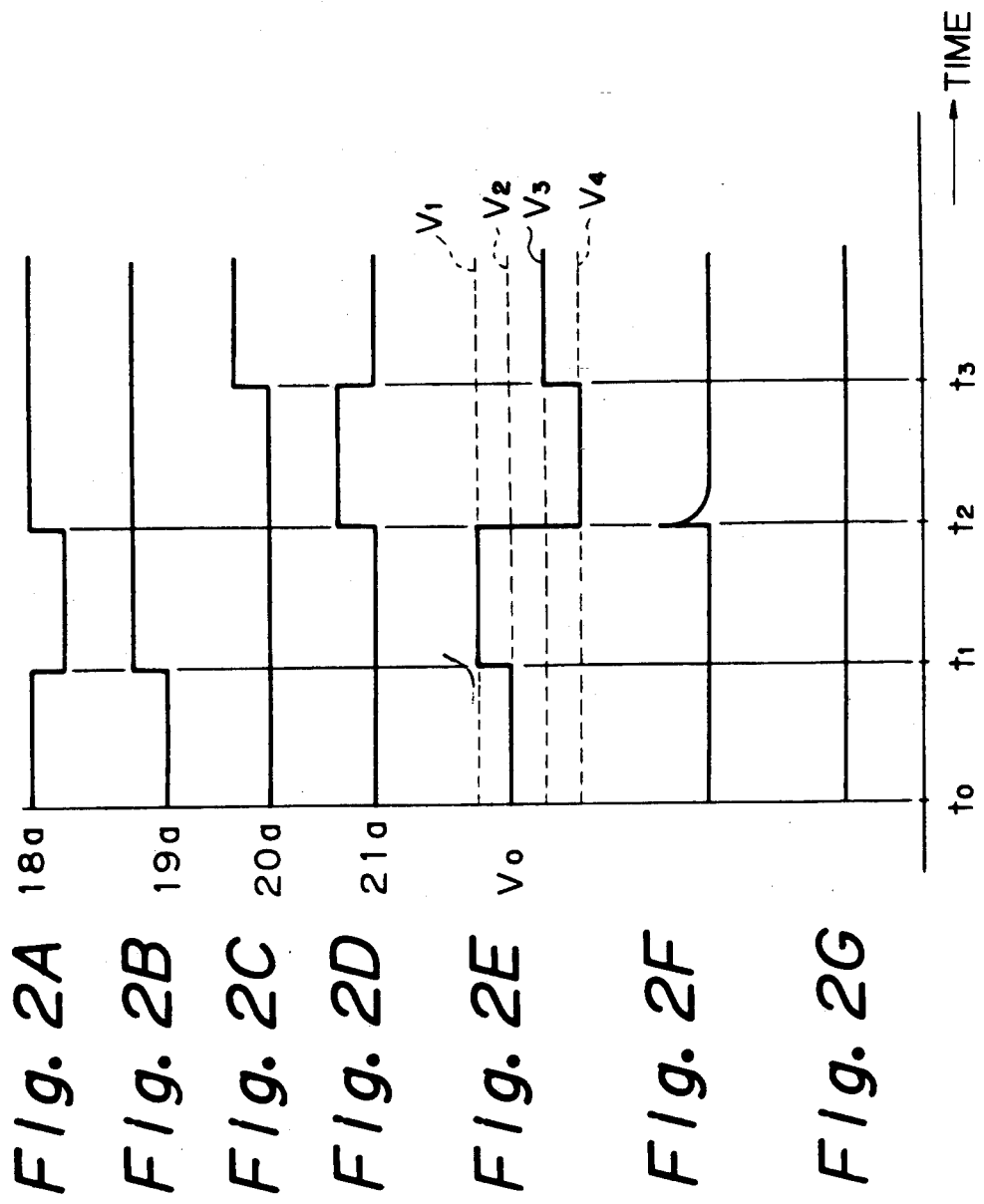
FIGS. 2A to 2G show waveforms indicative of specific operations of various sections of the circuit of FIG. 1.

Referring to FIG. 1 of the drawings, a multi-level selecting circuit embodying the present invention and applied to an LCD driver by way of example is shown. As shown, the multi-level selecting circuit, generally 42, has a first to a fourth input terminals, 1, 2, and 4, and a single output terminal 5. The selecting circuit 42 selects one of different bias voltages each being applied to the input terminals 1 to 4 and feeds it out via the output terminal 5. A bias circuit 6 generates such different bias voltages to be applied to the input terminals 1 to 4.

The bias circuit 6 includes a DC power source 7 and feeds a voltage of the positive side of the power source 7 directly to the first input terminal 1. Assuming that the output voltage of the power source 7 ranges from 5 volts to $-15$ volts, for example, then 5 volts is be fed to the input terminal 1. The bias circuit 6 further includes four resistors 8 to 11 and three operational amplifiers (OP AMPs) 12, 13 and 24. The resistors 8 to 11 are connected in series, and opposite terminals of the series connection are respectively connected to the positive and negative electrodes of the power source 7. The resistors 8 to 11 constitute a voltage divider 7a in combination. The junctions of the resistors 8 to 11 each is connected to the non-inverting input of respective one of the OP AMPs 12, 13 and 24, so that voltages appearing on the individual junctions are fed to the associated OP AMPs 12, 13 and 24. Specifically, the voltage on the junction of the resistors 8 and 9 is applied to the non-inverting input of the OP AMP 12, the potential on the junction of the resistors 9 and 10 is applied to the non-inverting input of the OP AMP 13, and the potential on the junction of the resistors 10 and 11 is applied to the non-inverting input of the OP AMP 24. In this embodiment, the resistor 11 is implemented as a variable resistor.

The OP AMPs 12, 13 and 24 each is provided with a voltage follower type configuration for feeding back the output voltage thereof directly to the non-inverting input. More specifically, the OP AMPs 12, 13 and 24 each outputs a voltage which has substantially the same level as the voltage applied to the non-inverting input and is not inverted in polarity. When the voltage divider 7a equally divides the output voltage of the DC power source 7, the OP AMPs 12, 13 and 24 produce respectively voltages of 0 volt, $-5$ volts and $-10$ volts on the output thereof. Such outputs of the OP AMPs 12, 13 and 24 are fed to the input terminals 2, 3 and 4, respectively. The selecting circuit 42 selects one of these input voltages at a time.

The selecting circuit 42 has a first to a fourth MOS transistors 14 to 17 which are respectively connected between the first to fourth input terminals 1 to 4 and the output terminal 5. The MOS transistors 14 and 15 each is constituted by a p-MOS transistor while the MOS transistors 16 and 17 each is constituted by an n-MOS transistor. The transistor 14 has a source and a back-gate thereof connected to the input terminal 1 by a first source connecting line $l_1$. The transistor 15 has a source thereof connected to the input terminal 2 by a second source connecting line $l_2$ and a back-gate thereof connected to the input terminal 1 by the line $l_1$. The transistor 16 has a source thereof connected to the input terminal 3 by a third source connecting line $l_3$ and a back-gate thereof connected to the input terminal 4 by a back-gate connecting line $l_6$. Further, the transistor 17 has a source thereof connected to the input terminal 4 by a fourth source connecting line $l_4$ and a back-gate thereof connected to the input terminal 4 by the line $l_6$. A current limiting resistor 22 is provided on the source connecting line $l_4$. The back-gate connecting line $l_6$ is connected to the input terminal 4, bypassing the resistor 22. A voltage clamping diode 45 is provided between the input terminals 3 and 4.

A first to a fourth control signal input terminal 18 to 21 are connected to the gates of the MOS transistors 14 to 17, respectively. Control signals or selection signals 18a to 21a are respectively applied to the transistors 14 to 17 via the terminals 18 to 21 to selectively cause the sources and drains of the individual transistors into conduction. In the illustrative embodiment, the control signals 18a to 21a render one of the transistors 14 to 17 conductive at a time and connects the conductive transistor to the output terminal 5. As as result, one of the voltages being applied to the input terminals 1 to 4 appears on the output terminal 5.

A reference will be made to FIGS. 2A to 2D for describing the operation of the multi-level selecting circuit 42 in detail. As shown at a time $t_0$, the control signals 19a to 21a coupled to the control signal input terminals 19 to 21 each goes low while the control signal 18a applied to the control signal input terminal 18 goes high. As a result, the MOS transistor 15 is turned on, and the MOS transistors 14, 16 and 17 are turned off. In this condition, the selecting circuit 42 selects the voltage $V_2$ applied to the input terminal 2 thereof and feeds it out via the output terminal 5 as an output voltage $V_0$.

At a time $t_1$, the control signals 18a and 19a go low and high, respectively. Then, the control signals 18a, 20a and 21a fed to the control signal input terminals 18, 20 and 21 each goes low while the control signal applied to the control signal input terminal 19 goes high. As a result, the transistor 14 is turned on while the other transistors 15, 16 and 17 are turned off. The selecting circuit 42, therefore, selects the voltage $V_1$ appearing on the input terminal 1 thereof and delivers it via the output terminal as an output $V_0$.

At a time $t_2$, the control signal input terminals 18, 19 and 21 each goes high while the control signal input terminal 20 goes low rendering only the transistor 17 conductive. In this condition, the selecting circuit 42 selects the voltage $V_4$ and feeds it out via the output terminal 5.

Further, at a time $t_3$, the control signals 18a, 19a and 20a on the control signal input terminals 18, 19 and 20 each goes high while the control signal 21a on the control signal input terminal 21 goes low. As a result, only the transistor 16 is turned on to cause the selecting circuit 42 to select the voltage $V_3$ appearing on the input terminal 3.

As any one of the MOS transistors 14 to 17 is turned on as stated above, a current flows through corresponding one of the source connecting lines $l_1$ to $l_4$. Assuming that the transistor 17, for example, is turned on at the time $t_2$, then a current $l_4$, FIG. 1, flows through the source connecting line $l_4$ with the result that the voltage on the line $l_4$ drops, as depicted in FIG. 2F. In this particular embodiment, the back-gate connecting line $l_6$ coupling the input terminal 4 to the back-gates of the transistors 16 and 17 is provided independently of the source connecting line $l_4$ in the vicinity of the input terminal 4. Therefore, no current flows through the back-gate connecting line $l_6$ which is adapted to apply a voltage to the back-gates of the transistors 16 and 17. As a result, the voltage does not drop at the back-gates of the transistors 16 and 17 despite the voltage drop on the source connecting line $l_4$, as shown in FIG. 2G.

In the embodiment, due to the resistor 22 provided on the source connecting line $l_4$, the resistance between the transistor 17 and the input terminal 4 is the sum of the resistance of the source connecting line $l_4$ and the resistance of the resistor 22. When the current $l_4$ flows through the source connecting line $l_4$, a voltage drop associated such a composite resistance and the current occurs thereon. For example, assuming that the resistor 22 has a resistance of 50 ohms, that the source connecting line $l_4$ has a resistance of 10 ohms, and that the voltage drop is 18 volts, then the current $l_4$ caused to flow through the line $l_4$ is 0.3 ampere. This current is only about one-third of a current particular to a prior art selecting circuit which will be described specifically later.

When the voltage on the source connecting line $l_4$ drops by 18 volts as stated above, the source voltage of the transistor 17 rises by 18 volts and exceeds the voltage $V_3$ appearing on the input terminal 3. Then, an overvoltage applied to the back-gate of the transistor 17 would cause the selecting circuit 42 to latch up. In this embodiment, since the back-gate voltages of the MOS transistors 16 and 17 are fed over the back-gate connecting line $l_6$ to the input terminal 4, they are maintained at the voltage $V_4$ (15 volts) which is lower than 18 volts. Hence, even when the voltage on the source connecting line $l_4$ drops, it does not become an overvoltage which would cause the selecting circuit 42 to latch up.

In practice, the wiring interconnecting the input terminal 4 and the OP AMP 24 that feeds the voltage $V_4$ to the input terminal 4 has a resistance. This, coupled with the output impedance of the OP AMP 24 itself, causes the voltage on the source connecting line $l_4$ to drop in response to the current $l_4$. Nevertheless, since the embodiment reduces the current $l_4$ to about one-third of the current particular to a conventional circuit, the probability of latch-up is about one-third so long as the selecting circuit 42 is placed under the same ambient conditions as the conventional circuit.

As shown in FIG. 1, a diode 45 is connected at a cathode thereof to the input terminal 3 which receives a higher voltage than the input terminal 4. The anode of the diode 45 is connected to the input termial 4. Specifically, the diode 45 is connected between the input terminals 3 and 4 and has a forward characteristic from the terminal 4 side to the terminal 3 side. In this configuration, even when the voltage on the input terminal 4 becomes higher than the voltage on the input terminal 3, the voltage difference between the terminals 3 and 4 is clamped to a range lower than the forward voltage of the diode 45. This eliminates voltage reversals greater than 0.7 volt in the case of a silicon diode, voltage reversals greater than 0.3 volt in the case of a germanium diode, and voltage reversals greater than 0.2 volt in the case of a Schottky diode, thereby preventing the latch-up more positively.

Figure 3:
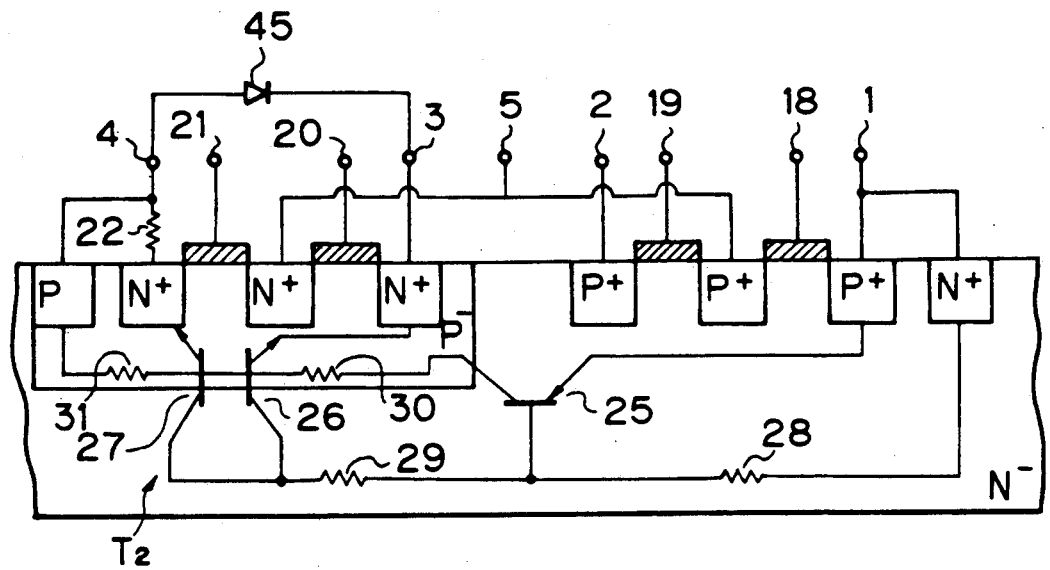
FIG. 3 is a section of a p-well type CMOS which is representative of the selecting circuit shown in FIG. 1.
Figure 4:
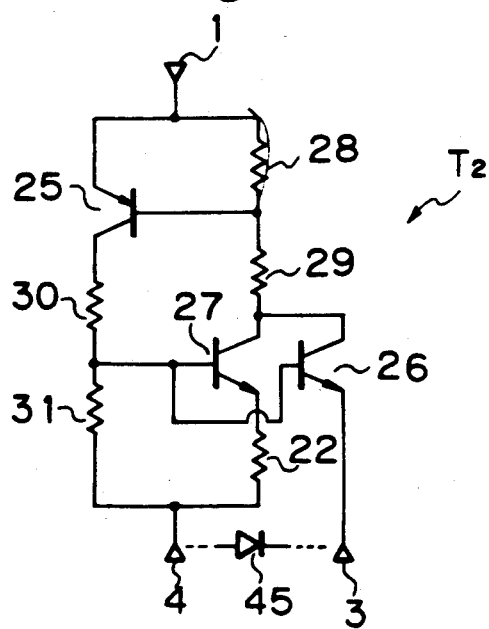
FIG. 4 is a circuit diagram indicative of a parasitic thyristor particular to the structure shown in FIG. 3.

Referring to FIGS. 3 and 4, a CMOS circuit having a p-well structure and implemented with the embodiment of FIG. 1 will be described. As shown in FIG. 3, the CMOS circuit has a p-n-p transistor 25 and n-p-n transistors 26 and 27 which are parasitic transistors, and resistors 28, 29, 30 and 31 which are parasitic resistors. As shown in FIG. 4, the transistors 25 to 27 and resistors 28 to 31 constitute a parasitic thyristor $T_2$ in combination. In FIGS. 3 and 4, substantially the same components as the components shown in FIG. 1 are designated by the same reference numerals, and redundant description will be avoided for simplicity.

In the CMOS circuit 42 having the parasitic thyristor $T_2$, the n-p-n transistor 26 is turned on when the voltage $V_4$ on the input terminal 4 exceeds the voltage $V_3$ on the input terminal 3 by more than 0.7 volt. Then, a current which is $\beta_{26}$ (current amplification factor of the transistor 26) times as great as the current that flows form the input terminal 1 to the base of the n-p-n transistor 26 via the resistors 28 and 29 flows to the collector of the transistor 26 as a collector current. The collector current develops a voltage difference between opposite terminals of the resistor 28, the voltage difference acting on the base and emitter of the p-n-p transistor 25. As a result, when a voltage difference greater than 0.7 volt is developed between opposite terminals of the resistor 28, the transistor 25 is rendered conductive to cause a collector current which is $\beta_{25}$ (current amplification factor of the transistor 25) times as great as the base current to flow through the collector thereof.

The above-mentioned collector current flows through the resistors 30 and 31 to the input terminal 4. Hence, on the turn-on of the p-n-p transistor 25, a voltage different is developed between opposite terminals of the resistor 31. This voltage difference is applied to the base and emitter of the n-p-n transistor 27. As the voltage difference exceeds 0.7 volt, it turns on the transistor 27 with the result that a current which is $\beta_{27}$ (current amplification factor of the transistor 27) times as great as the base current flows from the collector to the emitter. In this case, however, the sum of the base and collector currents flows as an emitter current through the resistor 22 which is connected to the emitter of the transistor 27 for the current limiting purpose. As a result, the voltage drops at opposite terminals of the resistor 22 to limit the base current. Specifically, the resistance between the emitter of the n-p-n transistor 27 and the input terminal 4 has heretofore been 10 ohms which is the resistance of the source connecting line l₄, while it is 60 ohms in the illustrative embodiment which is the sum of the resistances of the line l₄ and resistor 22. More specifically, the resistance connected to the emitter in the embodiment is six times as great as the conventional resistance, so that the emitter current of the embodiment is only one-sixth of the conventional emitter current. Stated another way, the transistor 27 plays the role of an emitter follower, resulting in an increase in the input impedance thereof. Consequently, the collector current of the p-n-p transistor 25 increases and thereby frees the circuit from latch-up even when the voltages on opposite sides of the resistor 31 increase.

The increase in the voltage appearing on the emitter of the n-p-n transistor 27 limits the collector current and thereby prevents the voltages on opposite terminals of the resistor 28 from undergoing a noticeable drop. In most cases, therefore, the voltage drop occurring on opposite terminals of the resistor 28 is suppressed to below the base-emitter voltage of the p-n-p transistor 25, eliminating the latch-up of the circuit. On the lapse of 3 microseconds, for example, the voltage on the input terminal 4 is restored to the original value V₄, and the transistor 25 is turned off.

The diode 45 is connected between the input terminals 3 and 4, as stated earlier. In this configuration, the voltage reversal between the input terminals 3 and 4 does not exceed the forward voltage of the diode 45, so that the latch-up ascribable to a voltage reversal is eliminated.

Figure 13:
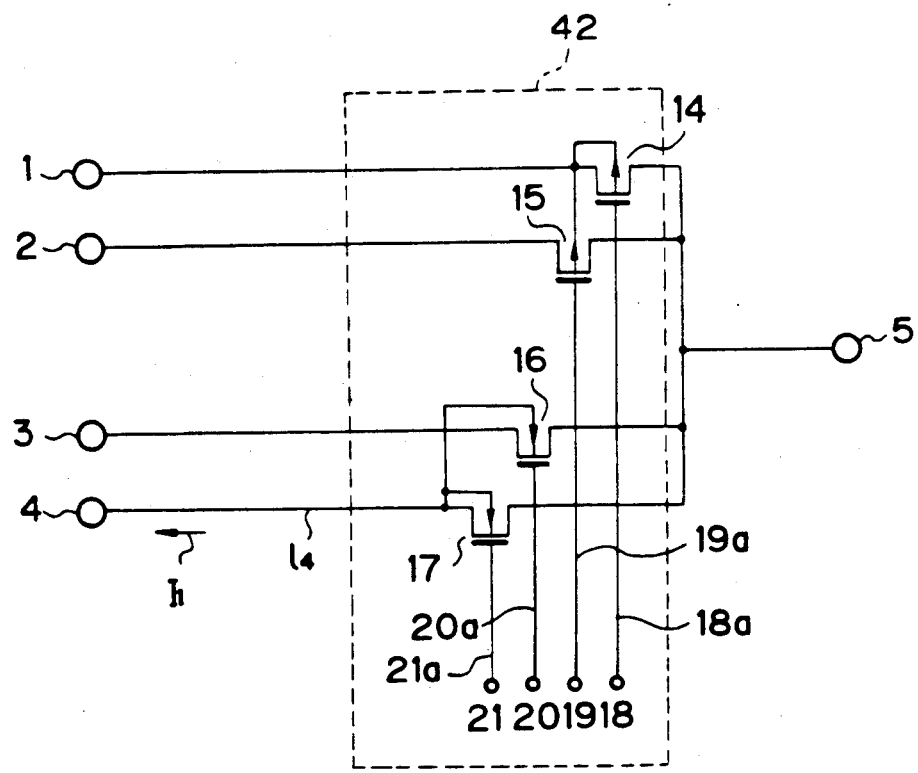
FIG. 13 is a circuit diagram showing a prior art multi-level selecting circuit.
Figure 14:
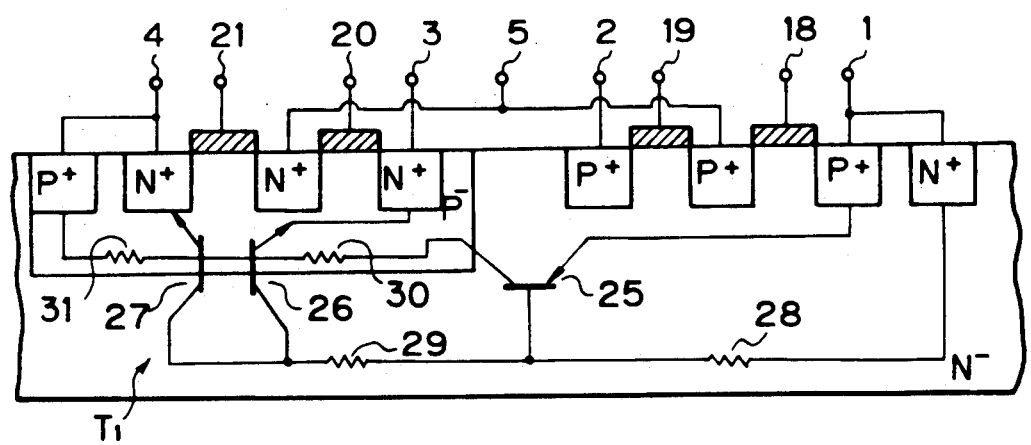
FIG. 14 is a section of a p-well type C-MOS which is representative of an output section of the prior art circuit.
Figure 15:
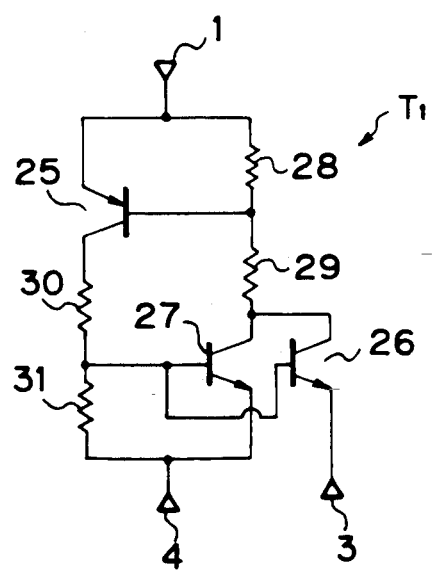
FIG. 15 is a circuit diagram indicative indicative of a parasitic thyristor particular to the structure shown in FIG. 14.

To better understand the present invention, the illustrative embodiment of FIGS. 1 to 4 will be compared with a prior art multi-level selecting circuit, shown in FIGS. 13 to 15. As FIG. 13 indicates, the prior art selecting circuit, generally 42, is different from the embodiment of FIG. 1 in that the back-gate connecting line l₆ is absent, in that the back gates of the MOS transistors 16 and 17 are connected to the source connecting line l₄, in that the line l₄ lacks the current limiting resistor 22, and in that the clamping diode 45 is absent.

Assume that the prior art selecting circuit 42 is applied to an LCD driver having a great number of output terminals such as eighty output terminals and is fabricated by a p-well CMOS process. When the selecting circuit 42 drives an LCD which is a capacitive load (assuming 600 picofarads per output, then 48 nanofarads for eighty outputs), a great current (I=48 nanofarads×20 volts per microsecond=0.96 ampere or approximately 1 ampere) flows from the output terminal 5 to the OP AMP 24 via the n-MOS transistor 17 and input terminal 4 in a moment (e.g. 1 microsecond) when the LCD discharges. Assume that the input terminal 4 and the source of the n-MOS transistor 17 are connected by an aluminum wiring whose resistance is 10 ohms or so. Then, when a current of 1 ampere flows through the wiring or line, the voltage on the line drops by 10 volts. The resulted voltage is 5 volts higher than the back-gate voltage of the n-MOS transistors 17 and 16, causing the circuit to latch up. This latch-up is ascribable to the structure of a CMOS transistor, as will be described hereinafter.

FIG. 14 shows a p-well type CMOS transistor applicable the above-described prior art multi-level selecting circuit. In FIG. 14, the components corresponding to those shown in FIG. 13 are designated by the same reference numerals. The selecting circuit has a p-n-p transistor 25, n-p-n transistors 26 and 27, and resistors 28, 29, 30 and 31 which constitute in combination a parasitic thyristor T₁, as shown in FIG. 15. In this configuration, when the voltage on the input terminal 4 exceeds the voltage on the input terminal 3 by 5 volts, for example, it turns on the transistor 26 since it is higher than the base-emitter voltage $V_{be}$ of the transistor 26 which is 0.7 volt. As a result, a collector current which is $\beta_{26}$ times as great as the base current flows from the collector to the emitter of the transistor 26. Since this collector current flow from the input terminal 1 through the resistors 28 and 29, such a voltage reversal causes a voltage difference to occur between opposite terminals of the resistor 28 and applies it across the base and emitter of the p-n-p transistor 25. Hence, as the voltage difference of the resistor 28 exceeds the base-emitter voltage $V_{be}$ of the transistor 25, the transistor 25 is turned on with the result that a collector current which is $\beta_{25}$ times as great as the base current flows from the emitter to the collector. This collector current flows through the resistors 30 and 31 to the input terminal 4, developing a voltage difference between opposite terminals of the resistor 31. Such a voltage difference of the resistor 31 is applied to between the base and the emitter of the transistor 27. Hence, when it exceeds the base-emitter voltage $V_{be}$ of the transistor 27 which is 0.7 volt, the transistor 27 is turned on. Then, a collector current $\beta_{27}$ times as great as the base current flows from the collector to the emitter of the transistor 27. The transistors 27 and 25, therefore, remain conductive even when the voltage on the input terminal 4 is restored to original in, for example, 1 microsecond to turn off the transistor 26. As a result, the parasitic thyristor T₁ is not turned off to cause the selecting circuit 42 to latch up.

In the light of the above, the embodiment of FIGS. 1 to 5 has the back-gate connecting line l₆ independent of the source connecting line l₄, the current limiting resistor 22 connecting to the line l₄, and the clamping diode 45 between the input terminals 3 and 4. While the latch-up has been described as being triggered by the n-MOS transistor in the p-well structure shown in FIGS. 14 and 15, it also occurs when the p-MOS transistor 14 is turned on. Specifically, on the turn-on of the p-MOS transistor 14, the current flowing from the input terminal 1 through the transistor 14 and output terminal 5 will increase to cause the voltage on the source of the transistor 14 to noticeably drop (by more than 5.7 volts). An n-well type CMOS also suffers from such latch-up. Although the illustrative embodiment has been applied to the lowest voltage side of a p-well structure, it is similarly applicable to the highest voltage side of an n-well structure, although not shown or described herein.

Figure 5:
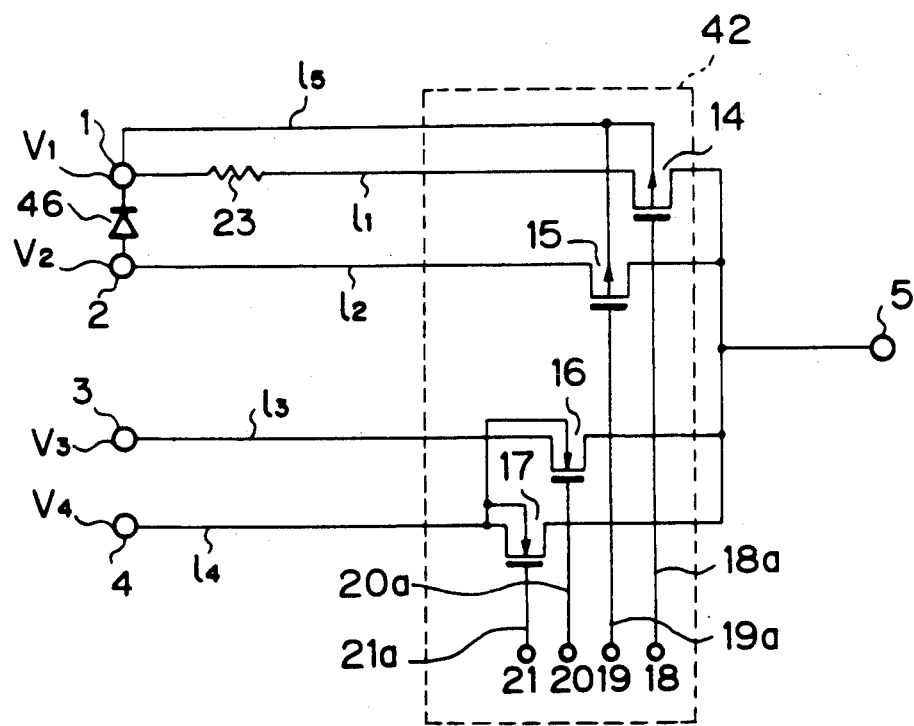
FIG. 5 is a circuit diagram showing an alternative embodiment of the present invention.

Referring to FIG. 5, an alternative embodiment of the present invention applied to the highest voltage side is shown. As shown, a current limiting resistor 23 is connected to the source connecting line l₁ that connects the input terminal 1 and the source of the MOS transistor 14. A back-gate connecting line l₅ is provided for feeding the voltage of the input terminal 1 to the back-gates of the MOS transistors 14 and 15. A diode 46 is connected between the input terminals 1 and 2.

Figure 6:
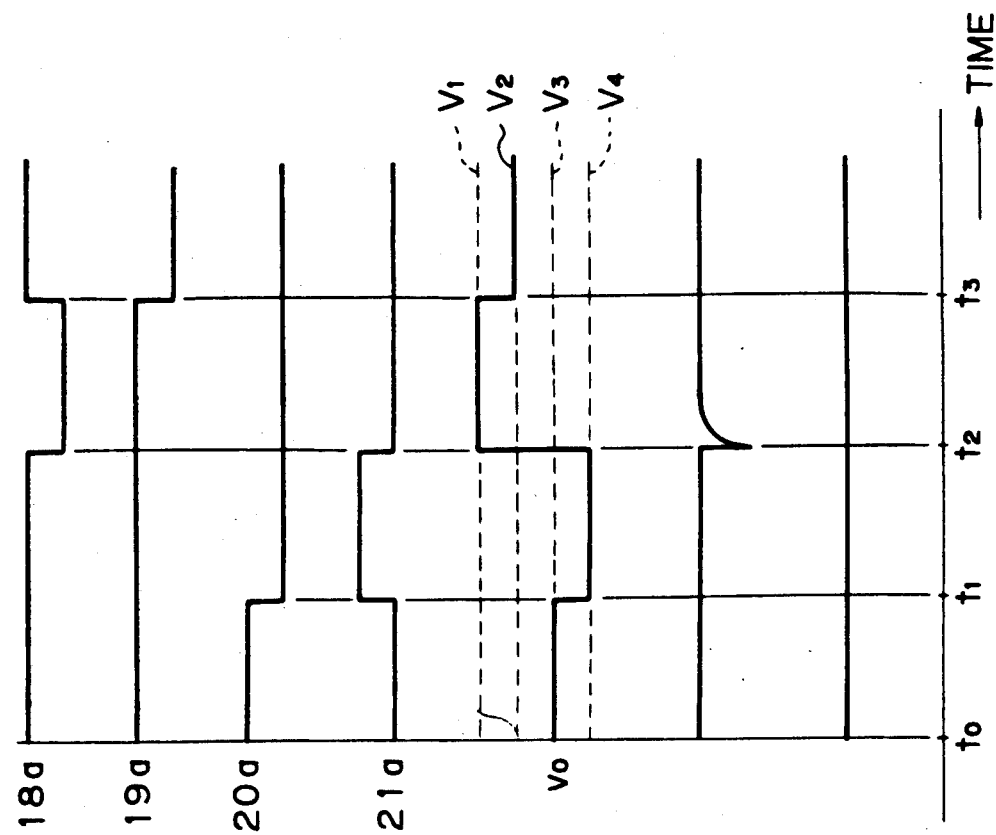
FIGS. 6A to 6G show waveforms indicative of specific operations of various sections included in the circuit of FIG. 5.

The operation of the embodiment shown in FIG. 5 will be described with reference to the timing chart of FIGS. 6A to 6D. First, at a time $t_0$, the control signals 18a, 19a and 20a applied to the control signal input terminals 18, 19 and 20, respectively, each goes high while the control signal 21a applied to the control signal input terminal 21 goes low. As a result, the MOS transistor 16 is turned on, and the other MOS transistors 14, 15 and 17 are turned off. Then, as shown in FIG. 6E, the voltage $V_3$ appearing on the input terminal 3 is selected and fed out via the output terminal 5 as an output voltage $V_0$. At a time $t_1$, the control signals 20a and 21a go low and high, respectively, so that only the transistor 17 is rendered conductive. At this time, the voltae $V_4$ appearing on the input terminal 4 is selected and fed out via the output terminal 5. At a time $t_2$, both of the control signals 18a and 21a go low with the result that the voltage $V_1$ on the input terminal 1 is selected. Further, at a time $t_3$, the control signals 18a and 19a go high and low, respectively, causing the voltage $V_2$ on the input terminal 2 to be selected.

In the illustrative embodiment, every time the transistor 14 is turned on, a current flows through the source connecting line $l_1$. The back-gate connecting line $l_5$ is associated with the source connecting line $l_1$ for feeding the voltage $V_1$ of the input terminal 1 to the back gates of the transistors 14 and 15, as stated earlier. Assume that the transistor 14 has been turned on, as shown in FIG. 6F, and the resultant current flowing through the source connecting line $l_1$ has caused the voltage on the line $l_1$ to drop. In this condition, the back-gate connecting line $l_5$ successfully prevents the voltage of the back gates of the transistors 14 and 15 from dropping, as shown in FIG. 6G.

The source connecting line $l_1$ has the current limiting resistor 23 thereon, as stated previously. In this condition, the resistance between the transistor 14 and the input terminal 1 is the sum of the resistance of the line $l_1$ itself and the resistance of the resistor 23. It follows that the current caused to flow through the line $l_1$ lowers the voltage on the line $l_1$ sharply. For example, assuming that the wiring resistance of the line $l_1$ is 10 ohms, that the resistance of the resistor 23 is 50 ohms, and that a voltage drop of 18 volts has occurred on the line $l_1$, then a current of 0.3 ampere flows through the line $l_1$. At this instant, although the voltage applied to the transistor 14 drops by 18 volts to become lower than the voltage $V_2$ applied to the input terminal 2, the selecting circuit 42 does not latch up since the back gates of the transistors 14 and 15 are held at the voltage $V_1$.

In the above condition, the voltage is lowered between the input terminal 1 and a DC power source, not shown. Nevertheless, the current flowing through the wiring that connects the input terminal 1 and the DC power source is only one-third of the current particular to the prior art. The probability of latch-up is, therefore, only one-third, compared to the prior art, so long as the ambient conditions are the same.

The diode 46 connected between the input terminals 1 and 2 is another implementation for eliminating the latch-up of the selecting circuit 42. Specifically, when the voltage between the input terminals 1 and 2 is reversed, the diode 46 clamps the reversed voltage to below the forward voltage thereof.

The illustrative embodiment reduces the saturation current to about one-third of the conventional saturation current, but it is the same as the prior art regarding the non-saturation current. Hence, when the embodiment drives a capacitive load such as an LCD, it needs an about 2.5 times longer charging and discharging time. This, however, does not matter at all in practice since the charging and discharging time is as short as about 1 microsecond or so. Specifically, even though the charging and discharging time may be increased to about 2.5 microseconds due to the 2.5 times longer charging and discharging time, it is not more than 72 microseconds to 36 microseconds with an LCD whose duty is about 1/200 to about 1/400, i.e., the distortion of the waveform is not greater than about 3.5 percent to 7 percent.

Figure 7:
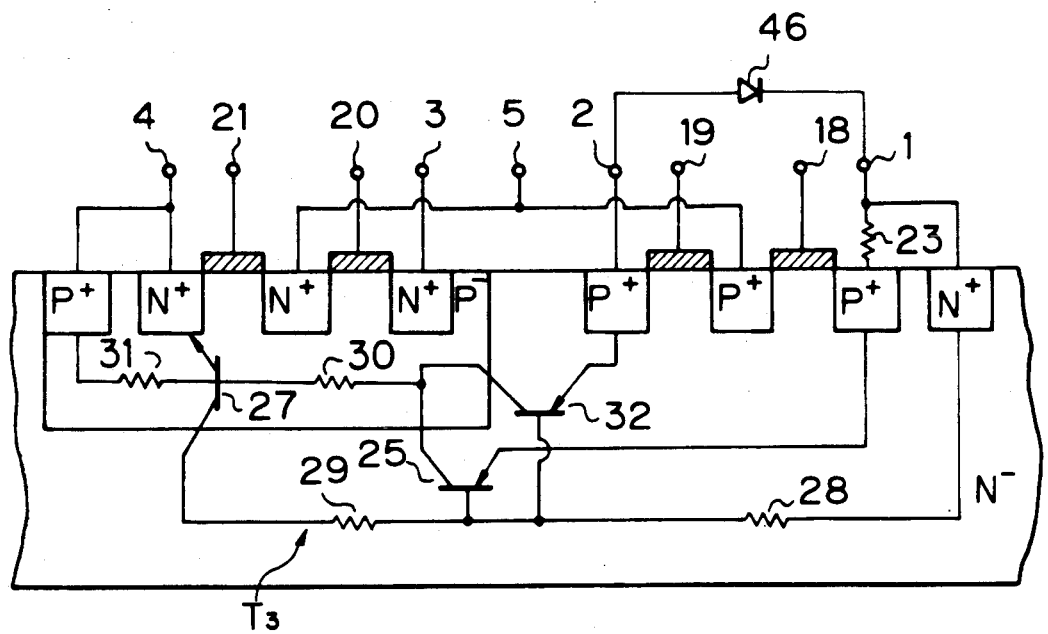
FIG. 7 is a view similar to FIG. 3 and representative of the circuit of FIG. 5.
Figure 8:
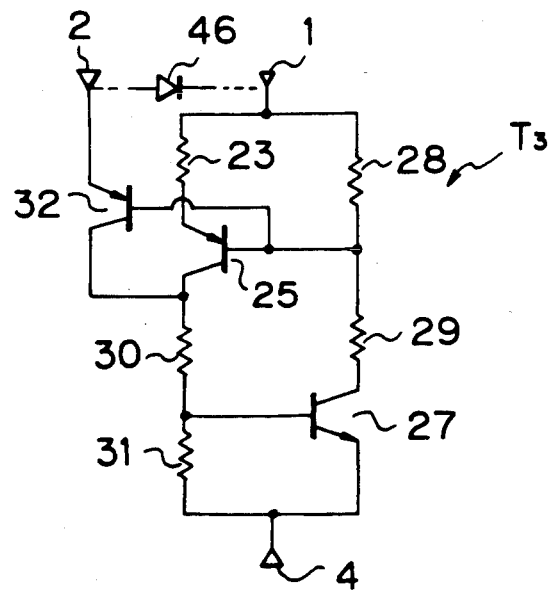
FIG. 8 is a circuit diagram showing a parasitic thyristor particular to the structure of FIG. 7.

FIG. 7 shows a p-well type C-MOS representative of the selecting circuit 42 of FIG. 5. A parasitic thyristor included in the C-MOS of FIG. 7 is depicted in FIG. 8. As shown in the figures, a parasitic thyristor $T_3$ is constituted by p-n-p transistors 32 and 25 and an n-p-n transistor 27 which are parasitic transistors, and resistors 28, 29, 30 and 31 which are parasitic resistors.

In the thyristor $T_3$, when the voltage applied to the input terminal 1 becomes lower than the voltage applied to the input terminal 2 by more than 0.7 volt, the transistor 32 is turned on. As a result, a collector current which is $\beta_{32}$ (current amplification factor of the transistor 32) times as great as a base current flows to the collector of the transistor 32. This collector current flows through the resistors 30 and 31 to the input terminal 4, causing the voltages on opposite terminals of the resistor 31 to drop. Consequently, the voltages on opposite terminals of the resistor 31 are applied to the base and emitter of the transistor 27. Therefore, the transistor 27 is turned on when the voltage is lowered by more than 0.7 volt. Then, a collector current $\beta_{27}$ (current amplification factor of the transistor) times greater than a base current flows to the collector of the transistor 27. This collector current flows from the input terminal 1 to the collector of the transistor 27 via the resistors 28 and 29, causing the voltages on opposite terminals of the resistor 28 to drop. On the drop of the voltage by more than 0.7 volt, the voltages on opposite terminals of the resistor 28 are applied to the base and emitter of the transistor 27 with the result that the transistor 25 is rendered conductive. Consequently, a current $\beta_{25}$ (current amplification ratio of the transistor 25) times greater than a base current flows from the emitter to the collector of the transistor 25.

The current limiting resistor 23 is connected to the emitter of the p-n-p transistor 25. Hence, when a current which is the sum of the base current and collector current of the transistor 25 flows through the resistor 23, the voltages on opposite terminals of the resistor 23 are noticeably lowered. In this condition, a great base current does not flow in the transistor 25. Specifically, since the resistance connected to the emitter of the transistor 25 is six times as high as the conventional resistance, the base current is reduced to one-sixth so long as the base voltage is the same as the conventional one. Stated another way, the transistor 25 plays the role of an emitter follower due to the current limiting resistor 23. It follows that the base current and, therefore, the collector current of the transistor 25 does not increase, preventing the selecting circuit from latching up. Since the collector current of the transistor 25 does not increase, the voltage drop of the resistor 31 that occurs when the voltage of the input terminal 1 is restored to original is less than 0.7 volt and, therefore, does not cause latch-up. Further, the diode 46 connected between the input terminals 1 and 2 prevents the voltage reversal which may occur between the terminals 1 and 2 from exceeding the forward voltage of the diode 46. This eliminates the occurrence that the transistor 32 is turned on by a voltage reversal and, therefore, the latch-up ascribable to a voltage reversal.

The illustrative embodiment will operated in the manner described even when applied to the highest voltage side of an n-well structure.

When the diode 45 or 46 shown and described is built in an IC, such a diode may be associated with the highest or the lowest voltage input terminal and all of a plurality of medium voltage input terminals, or with only one of such input terminals. On the other hand, when the diode 45 or 46 is provided outside an IC, it is not necessary to provide each IC with more than one diodes, as will be described hereinafter.

Assume that the prior art circuit of FIG. 13 is applied to an LCD driver IC having a great number of output terminals such as eighty output terminals, and that eight such ICs are used to drive an LCD panel. Then, the following problem is brought about. Assuming that a capacitive load in the form of an LCD has a capacitance of 600 picofarads per output, then the total capacitance is 48 nonofarads for 80 outputs. When such an LCD discharges after charging, a great current (I=48 nonofarads × 20 volts/microsecond = 0.96 ampere or approximately 1 ampere) flows from the input terminal 4 to the output terminal of the OP AMP 24 in a moment (e.g. 1 microsecond). Therefore, when eight ICs are used, a current of 8 amperes flows to the OP AMP 24 in total.

It is a common practice with an OP AMP to insert a low resistance such as 1 ohm on the output side for preventing it from oscillating and protecting it against damage in the event when the output is shorted. The current capacity of the output of an OP AMP is as small as 10 milliamperes to 100 milliamperes. Therefore, the current available with an OP AMP is not greater than 1 ampere to 2 amperes even when a power booster is connected to the output thereof. In this condition, the current of 8 amperes applied to an OP AMP causes the voltage to drop by at least about 8 volts. As a result, the back-gate voltage of the MOS transistor 16 exceeds the source voltage of the same, causing the circuit to latch up.

Figure 9:
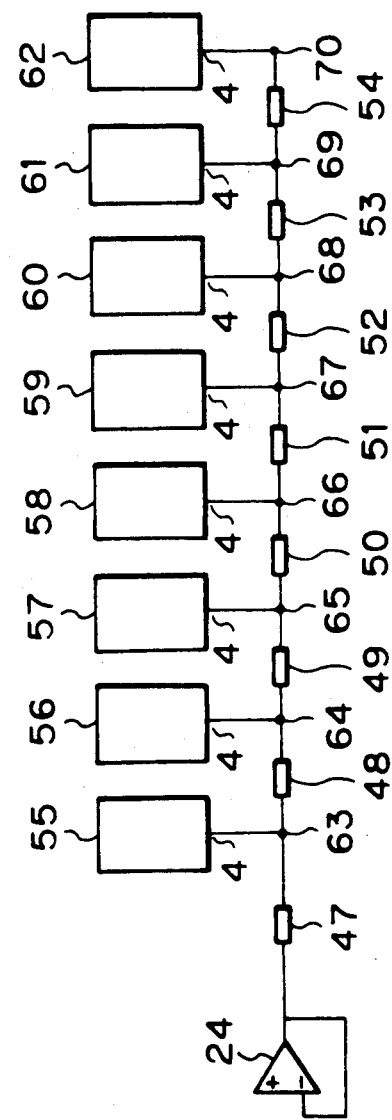
FIG. 9 is a schematic block diagram showing external wirings of an LCD driver.

FIG. 9 depicts wirings connecting the OP AMP 24 which feeds the fourth voltage $V_4$, eight driver ICs 55 to 62 each driving eighty output, and impedances 47 to 54 representative of resistances involved in the wirings of a substrate and the connections of lines. The substrate and lines are generally made of copper, in which case the resistance component ranges from several tens to several hundreds of milliohms. Then, even if the line with the impedance 47 is as long as 1 meter, the resistance amounts to about several hundreds of milliohms. Assuming that the lines with the impedances 48 to 54 each extends over about 10 centimeters, then the resistance amounts to 10 milliohms and causes a voltage drop of about 1 volt to occur. For example, when the impedance 47 is 100 milliohms and the impedances 48 to 54 are 10 milliohms each, the total resistance is 170 milliohms and causes the voltage to drop by 1.08 volts.

Even if the impedance 47 is 30 milliohms, the total resistance is 100 milliohms and, therefore, the voltage drop is 0.52 volt. However, the inductance component is several microhenries for about 1 meter of wiring with the impedance 47 and is several hundred nanohenries for about 10 centimeters of wirings with the impedances 48 to 54. On the other hand, assuming that the current increases or decreases within 1 microsecond, it is at least 2 megahertz in terms of frequency. Hence, the impedance 47 is expressed as $2\pi fL = 2 \times 3.14 \times 2 \times 10^6 \times 1 \times 10^{-6} = 12.56$ ohms. Likewise, the impedances 48 to 54 are 1.256 ohms. A voltage drop due to such impedances is 135.648 volts. In this case, when the wiring with the impedance 47 is about 30 centimeters long and the impedance 47 is 3.718 ohms, the voltage drop is 65.312 volts. In practice, the voltage does not drop to such a degree since the difference between the maximum and minimum voltages is as small as 20 volts. However, in this example, it is obvious that the voltage eventually rises to the vicinity of the maximum voltage to latch up the circuit. Hence, when the diode 45 or 46 is provided outside an IC, it is necessary to provide each IC with one diode.

On the other hand, assume that the capacitance of the LCD is reduced to one-fourth, and that the wiring of the power source is strengthened to reduce the wiring impedance to one-fourth. Then, if the impedance 47 is 3.142 ohms and the wiring is 1 meter long, a current of 2 amperes flows through the impedance 47 to increase the voltage appearing on the junction 63 by 6.284 volts. If the impedance 47 is 0.942 ohms and the wiring is 30 centimeters long, the voltage on the junction 63 is raised by 3.768 volts. Therefore, a diode has to be provided between the input terminals of the IC 55 to which the voltages $V_4$ and $V_3$ are applied. When this diode is implemented as a Schottky diode, the voltage reversal can be clamped at 0.2 volt. Assuming that the impedance 48 is 0.314 ohm and the wiring associated therewith is 10 centimeters long, a current of 1.75 amperes flows through the impedance 48 to raise the voltage on the junction 64 by 0.5495 volt. However, the total voltage drop is 0.7495 volt since the voltage on the junction 63 has already risen by 0.2 volt. A diode, therefore, has to be connected between the terminals to which the voltages $V_4$ and $V_3$ of the IC 56 are applied. This diode is capable of clamping the voltage reversal at 0.2 volt when implemented as a Schottky diode. While a current of 1.5 amperes flows through the impedance 49 to raise the voltage on the junction 65 by 0.471 volt, the actual voltage is 0.671 volt since the voltage on the junction 64 has already risen by 0.2 volt. This voltage is lower than the base-emitter voltage (0.7 volt) of the transistor and, therefore, does not cause latch-up to occur, so that a diode does not have to be connected between the input terminals 4 and 3 of the IC 57. The current flowing through the impedance 50 is 1.25 amperes and raises the voltage on the junction 66 by 0.3925 volt. The total voltage appearing on the junction 66 is 1.0635 volts since the voltage on the junction 65 has risen by 0.671 volt. A diode, therefore, has to be connected between the input terminals 4 and 3 of the IC 58 and can clamp the voltage inversion at 0.2 volt when implemented as a Schottky diode. A current of 1 ampere flows through the impedance 51 to increase the voltage on the junction 67 by 0.514 volt, i.e. 0.314 volt plus 0.2 volt. This voltage is lower than 0.7 volt and does not cause latch-up to occur. Hence, it is not necessary to connect a diode between the input terminals 4 and 3 of the IC 59. A current of 0.75 ampere flows through the impedance 52 to increase the voltage on the junction 68 by 0.7495 volt, i.e., 0.2355 volt plus 0.314 volt plus 0.2 volt, whereby a diode is needed between the input terminals 4 and 3 of the IC 60. This diode can clamp the voltage reversal at 0.2 volt when use is made of a Schottky diode. A current of 0.5 ampere flows through the impedance 53 to increase the voltage on the junction 69 by 0.357 volt which is the sum of 0.157 volt and 0.2 volt. This voltage is lower than 0.7 volt and not causative of latch-up, so that a diode is not needed between the input terminals 4 and 3 of the IC 61. Further, a current of 0.25 ampere flows through the impedance 54 to raise the voltage on the junction 70 by 0.075 volt plus 0.357 volt. The resulted voltage is lower than 0.7 volt and does not cause latch-up to occur, so that a diode is not required between the put terminals 4 and 3 of the IC 62.

As stated above, in the specific configuration shown in FIG. 9, a diode has to be connected between the input terminals 4 and 3 of the ICs 55, 56, 58 and 60 and does not have to be connected between the input terminals 4 and 3 of the ICs 57, 59, 61 and 62. While the above description has concentrated on the input terminals 4 and 3, it is also true with the input terminals to which the highest voltage $V_1$ and medium voltage $V_2$ are applied.

Figure 10:
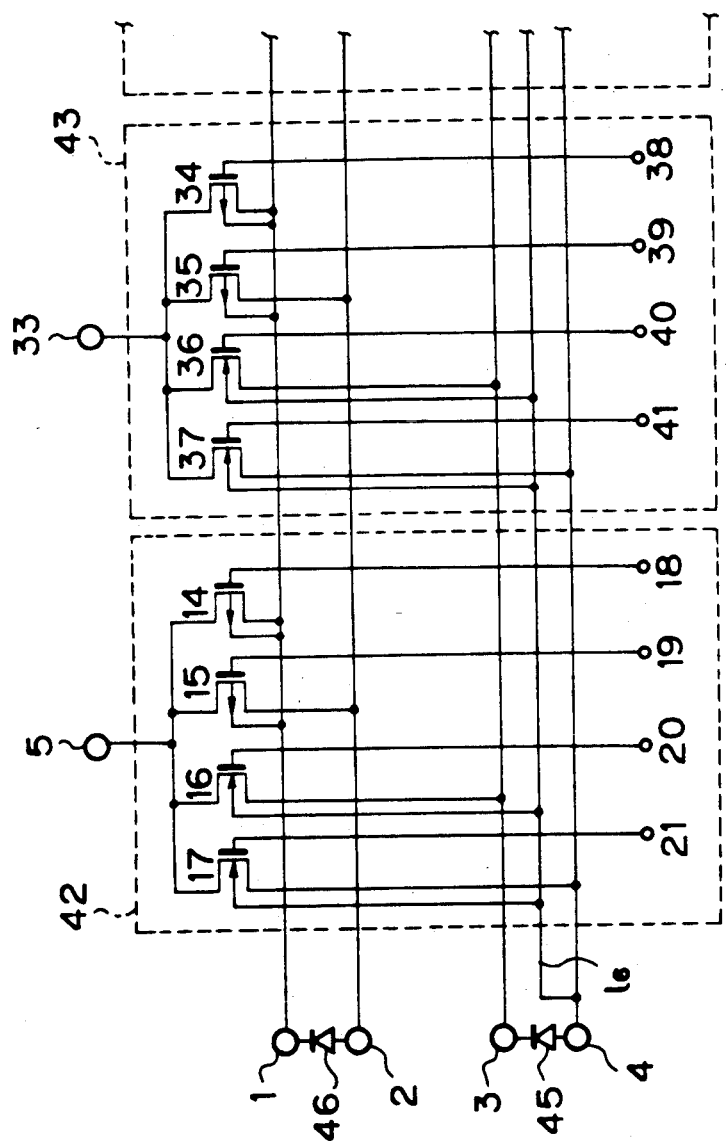
FIGS. 10, 11 and 12 are circuit diagrams showing other alternative embodiments of the present invention.
Figure 11:
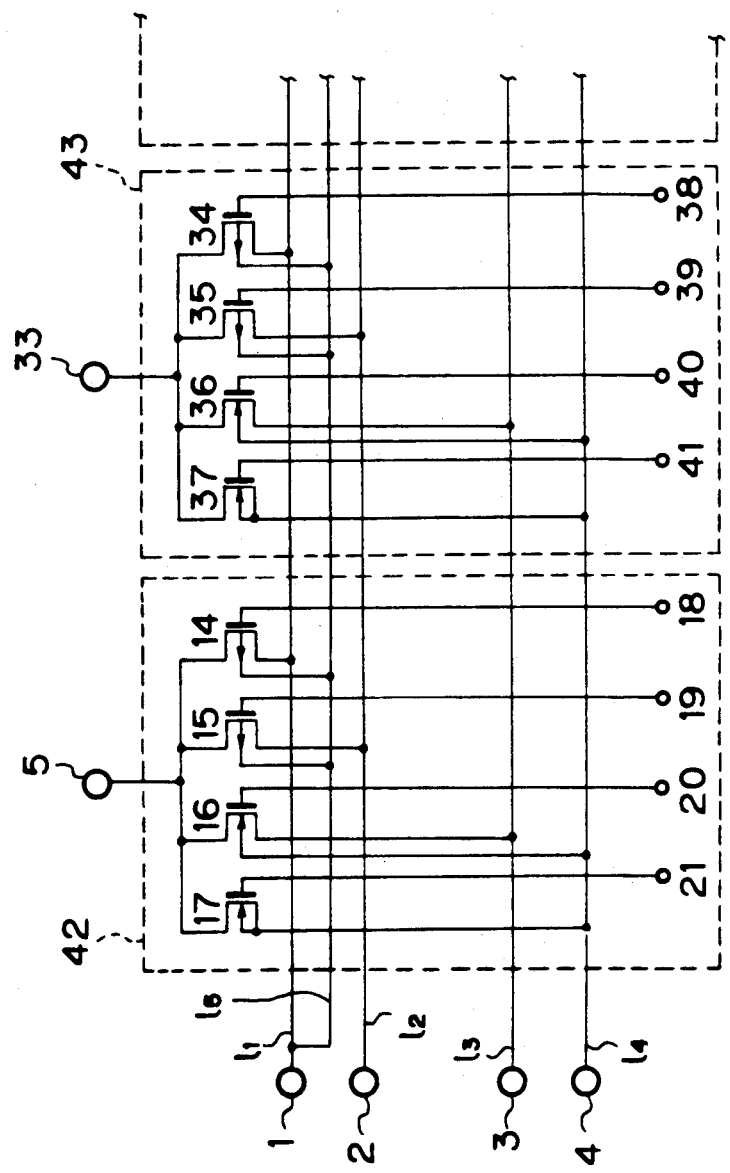
Figure 12:
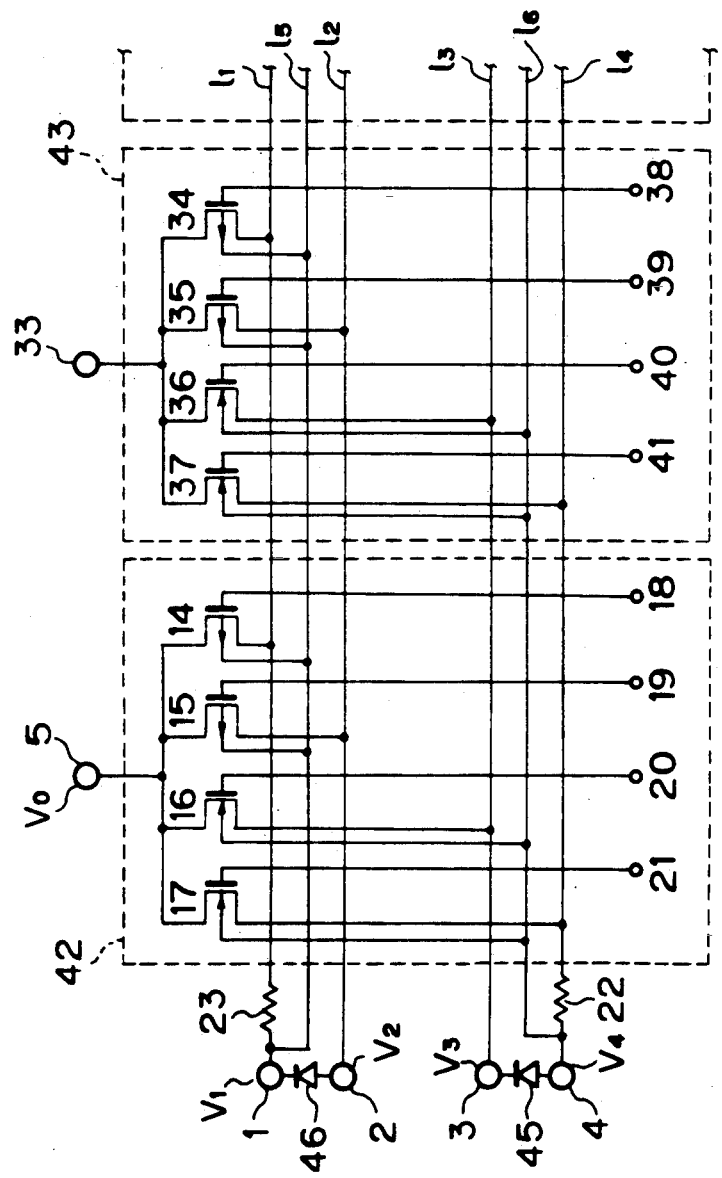

When the currents and wiring impedances are even lower than those mentioned in relation to FIG. 9, the number of ICs that need a diode further decreases and eventually decreases to one. Although the illustrative embodiments are constructed to output four different levels, the present invention is practicable with any circuitry that outputs three or more levels, as seen from the foregoing description. As shown in FIG. 10 or 11, a back-gate connecting line may be provided on only one of the low voltage side and high voltage side. Alternatively, as shown in FIG. 12, a back-gate connecting line may be provided on both of the low voltage and high voltage sides. While FIGS. 10 to 12 show only two selecting circuits 42 and 43, the illustrative embodiments each has eighty such circuits, for example, each of which selects voltages applied to the input terminals 1, 2, 3 and 4. The selecting circuit 43 is identical in construction with the selecting circuit 42. Specifically, the selecting circuit 43 has MOS transistors 34 to 37 corresponding to the MOS transistors 14 to 17, an output terminal 33 corresponding to the output terminal 5, and control signal input terminals 38 to 41 corresponding to the control signal input terminals 18 to 21. When all the selecting circuits 42 and 43 are caused into an identical state by the control signals applied to the terminals 18 to 21 and 38 to 41, a maximum current flows. It is not necessary to provide all the selecting circuits with the current limiting resistors 22 and 23 and diodes 45 and 46. When the resistors 22 and 23, for example, are used, one of them may be provided on a common source connecting line of the selecting circuits 42, 43 and so on or in each of such circuits, as shown in the illustrative embodiments. When each selecting circuit is provided with a resistor, the resistor may be implemented with polysilicon or similar substance having a relatively high resistance and wired in a jumper configuration. This is successful in completing jumper wiring and forming the resistor at the same time. While the present invention has been shown and described in relation to a switch or selecting circuit using MOS transistors, it is similarly applicable to a switch using both of p-MOSs and n-MOSs.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A multi-level selecting circuit comprising:
    selecting means provided in a semiconductor chip by a CMOS process for selecting one of a plurality of input levels at a time;
    input terminals provided on said semiconductor chip for feeding a plurality of levels to said selecting means; and
    an output terminal provided on said semiconductor chip for outputting one of the plurality of levels having been selected by said selecting means;
    said selecting means comprising:
        a plurality of MOS transistors each having a source electrode and a drain electrode and being provided in said semiconductor chip, said drain electrode of said MOS transistor being connected to said output terminal for feeding, when turned on by external control, the input level on said source electrode to said output terminal;
        source connecting lines each being connected between respective one of said input terminal and said source electrode of respective one of said MOS transistors for feeding a voltage on said input terminal to said source electrode; and
        a back-gate connecting line connected between said input terminals and back-gates of said MOS transistors for feeding a predetermined voltage applied to said input terminals to said back-gates, said back-gate connecting line being substantially independent of said source connecting lines.

2. A circuit in accordance with claim 1, wherein said circuit further comprises a current limiting resistor provided on any of said source connecting lines for limiting a current that flows through said source connecting line.

3. A circuit in accordance with claim 1, wherein said source connecting lines each is made of a conductive material having a higher resistance than metal.

4. A multi-level selecting circuit comprising:
    selecting means provided in a semiconductor chip by a CMOS process for selecting one of a plurality of input levels at a time;
    input terminals provided on said semiconductor chip for feeding a plurality of levels to said selecting means; and
    an output terminal provided on said semiconductor chip for outputting one of the plurality of levels having been selected by said selecting means;
    said selecting means comprising:
        a plurality of MOS transistors each having a source electrode and a drain electrode and being provided in said semiconductor chip, said drain electrode of said MOS transistor being connected to said output terminal for feeding, when turned on by external control, the input level on said source electrode to said output terminal;
        source connecting lines each being connected between respective one of said input terminals and source electrode of respective one of said MOS transistors for feeding a voltage on said input terminal to said source electrode; and a diode connected between one of said input terminals to which a highest or a lowest voltage is applied and another one of said input terminals to which a medium voltage close to said highest or lowest voltage is applied, said diode having an anode connected to the low voltage side and a cathode connected to the high voltage side.

5. A circuit in accordance with claim 4, wherein said diode comprises a Schottky diode.

6. A circuit in accordance with claimm 4, wherein said diode comprises a silicon diode.

7. A circuit in accordance with claim 4, wherein said diode comprises a germanium diode.

8. A multi-level selecting circuit comprising:
selecting means provided in a semiconductor chip by a CMOS process for selecting one of a plurality of input levels at a time;
input terminals provided on said semiconductor chip for feeding a plurality of levels to said selecting means; and
an output terminal provided on said semiconductor chip for outputting one of the plurality of levels having been selected by said selecting means;
said selecting means comprising:
a plurality of MOS transistors each having a source electrode and a drain electrode and being provided in said semiconductor chip, said drain electrode of said MOS transistor being connected, to said output terminal for feeding, when turned on by external control, the input level on said source electrode to said output terminal;
source connecting lines each being connected between respective one of said input terminals and said source electrode of respective one of said MOS transistors for feeding a voltage on said input terminal to said source electrode;
a back-gate connecting line connected between said input terminals and back-gates of said MOS transistors for feeding a predetermined voltage applied to said input terminals to said back-gates, said back-gate connecting line being substantially independent of said source connecting lines; and
a diode connected between one of said input terminals to which a highest voltage or a lowest voltage is applied and another one of said input terminals to which a medium voltage close to said highest or lowest voltage is applied, said diode having an anode connected to the low voltage side and a cathode connected to the high voltage side.

9. A circuit in accordance with claim 8, wherein said circuit further comprises a current limiting resistor provided on any of said source connecting lines for limiting a current that flows through said source connecting line.

10. A circuit in accordance with claim 8, wherein said source connecting lines each is made of a conductive material having a higher resistance than metal.

11. A circuit in accordance with claim 8, wherein said diode comprises a schottky diode.

12. A circuit in accordance with claim 8, wherein said diode comprises a silicon diode.

13. A circuit in accordance with claim 8, wherein said diode comprises a germanium diode.

* * * * *